United States Patent
Evans et al.

(10) Patent No.: US 10,443,934 B2
(45) Date of Patent: Oct. 15, 2019

(54) SUBSTRATE HANDLING AND HEATING SYSTEM

(71) Applicant: Varian Semiconductor Equipment Associates, Inc., Gloucester, MA (US)

(72) Inventors: Morgan D. Evans, Manchester, MA (US); Jason M. Schaller, Austin, TX (US); D. Jeffrey Lischer, Acton, MA (US); Ala Moradian, Beverly, MA (US); William T. Weaver, Austin, TX (US); Robert Brent Vopat, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 265 days.

(21) Appl. No.: 14/707,027

(22) Filed: May 8, 2015

(65) Prior Publication Data
US 2016/0329458 A1    Nov. 10, 2016

(51) Int. Cl.
*F26B 3/30*    (2006.01)
*H01L 21/67*    (2006.01)
*H01L 21/68*    (2006.01)

(52) U.S. Cl.
CPC .......... *F26B 3/30* (2013.01); *H01L 21/67115* (2013.01); *H01L 21/68* (2013.01)

(58) Field of Classification Search
CPC ...... F26B 3/30; H01L 21/67115; H01L 21/68; H01L 21/324; H01L 21/681; H01L 21/6719; H01L 21/67778; H01L 21/682; H01L 21/68707; H01L 21/68785; H01L 21/67173; H01L 21/67207; H01L 21/67259; H01L 21/76864

USPC ........................ 392/411, 432–434, 418, 416; 219/121.86, 76, 411, 444.1, 483, 220;
(Continued)

(56) References Cited

U.S. PATENT DOCUMENTS 6,222,991 B1 * 4/2001 Davenport ........ H01L 21/67103
118/724
8,328,494 B2    12/2012 Fish et al.
(Continued)

FOREIGN PATENT DOCUMENTS

JP    2009-055046 A    3/2009

OTHER PUBLICATIONS

Morgan D. Evans, Hybrid Thermal Electrostatic Clamp, US Non provisional application, filed Apr. 16, 2015.
(Continued)

*Primary Examiner* — Dana Ross
*Assistant Examiner* — Joseph M Baillargeon
(74) *Attorney, Agent, or Firm* — Nields, Lemack & Frame, LLC

(57) ABSTRACT

A system for heating substrates while being transported between the load lock and the platen is disclosed. The system comprises an array of light emitting diodes (LEDs) disposed above the alignment station. The LEDs may be GaN or GaP LEDs, which emit light at a wavelength which is readily absorbed by silicon, thus efficiently and quickly heating the substrate. The LEDs may be arranged so that the rotation of the substrate during alignment results in a uniform temperature profile of the substrate. Further, heating during alignment may also increase throughput and eliminate preheating stations that are currently associated with the processing chamber.

20 Claims, 9 Drawing Sheets

(58) Field of Classification Search
 USPC ........ 438/487, 795; 118/725, 719, 730, 668; 414/939, 935; 700/207; 250/492.2
 See application file for complete search history.

(56) References Cited

U.S. PATENT DOCUMENTS

| | | | |
|---|---|---|---|
| 8,404,499 B2* | 3/2013 | Moffatt | H01L 21/67115 219/390 |
| 9,248,425 B2* | 2/2016 | Linow | H01L 21/67115 |
| 2002/0000521 A1* | 1/2002 | Brown | H01L 21/67115 250/492.1 |
| 2003/0168175 A1 | 9/2003 | Kim et al. | |
| 2007/0006936 A1 | 1/2007 | Hosokawa et al. | |
| 2009/0116824 A1* | 5/2009 | Suzuki | H01L 21/67115 392/411 |
| 2010/0074604 A1* | 3/2010 | Koelmel | H01L 21/67098 392/408 |
| 2010/0301236 A1 | 12/2010 | Shieh et al. | |
| 2011/0291022 A1 | 12/2011 | Lee et al. | |
| 2013/0320208 A1 | 12/2013 | Lee et al. | |
| 2015/0103526 A1* | 4/2015 | Johnson | H01L 21/67115 362/249.06 |

OTHER PUBLICATIONS

International Search Report and Written Opinion dated Aug. 12, 2016 in corresponding PCT application No. PCT/US2016/029326.

* cited by examiner

SUBSTRATE HANDLING AND HEATING SYSTEM

FIELD

Embodiments of the present disclosure relate to system for heating a substrate, and more particularly, for heating a substrate while aligning the substrate prior to processing.

BACKGROUND

The fabrication of a semiconductor device involves a plurality of discrete and complex processes. The semiconductor substrate typically undergoes many processes during the fabrication process. These processes may occur in a processing chamber, which may be maintained at a different processing condition than the environment. For example, the processing chamber may be maintained at vacuum conditions. In certain embodiments, a load lock is used to separate the processing chamber from the external environment. One or more substrate handling robots are disposed in the processing chamber and move the substrate from the load lock to the platen on which the substrate is disposed during processing.

The processing chamber may also include an alignment station which aligns the substrate in the proper orientation. The substrate is removed from the load lock and placed on the alignment station by the substrate handling robot. This alignment station then rotates the substrate so that the notch, or index mark, on the substrate is disposed in a known position. In this way, the substrates are aligned in a known orientation prior to processing. After the orientation is completed, the substrate handling robot removes the substrate from the alignment station and places the substrate on the platen for processing.

Heating substrates before and/or after processing is common in many semiconductor fabrication processes. In many cases, the substrate is heated to a temperature close to the process temperature and then transported to the platen. This preheating may help prevent substrate warping, popping and movement when the cold substrate contacts the hot platen. These phenomenon may cause the creation of particles and mishandling, and may reduce overall process yield.

Additionally, in some embodiments, a substrate may be warmed after being subjected to a cold process to eliminate the possibility of condensation when the substrate exits the processing chamber.

In certain embodiments, a dedicated preheating station may be used to perform this function. The preheating station may comprise one or more infrared lamps that are focused on the substrate. While the preheating station is effective at raising the temperature of the substrate, the preheating station has a negative impact on throughput. Specifically, a substrate may be disposed at the preheating station for a significant amount of time in order for the substrate to reach the desired temperature.

In those embodiments using a preheating station, typically, after alignment, the substrate may be moved by the substrate handling robot to a preheating station, which warms the substrate. When the substrate has reached the target temperature, the substrate handling robot transfers the substrate from the preheating station to the platen.

However, this preheating station, while effective in heating the substrate, is time consuming. Further, the preheating station has to be within the reach of the substrate handling robot and therefore, the area near the load lock may become very congested, making maintenance and repair extremely difficult. Further, in certain embodiments, multiple load locks with multiple substrate handling robots are used. In these embodiments, there may also be multiple preheating stations, where each is associated with a respective substrate handling robot. The addition of preheating stations adds complexity and cost to the overall system. Further, these preheating stations also increase the overall size of the processing chamber.

It would be beneficial if there were an apparatus to heat the substrates without the use of a dedicated preheating station. As stated above, these preheating stations consume valuable space and also add processing time to each substrate, reducing throughput. Further, it would be beneficial if this heating could be accomplished without adding additional processing time or stations to the fabrication process. It would be advantageous if the substrate could be heated while being oriented on the alignment station. In this way, the time used to orient the substrate could also be used to heat the substrate, which reduces the time dedicated to heating the substrate and increasing throughput.

SUMMARY

A system for heating substrates while being transported between the load lock and the platen is disclosed. The system comprises an array of light emitting diodes (LEDs) disposed above the alignment station. The LEDs may be GaN or GaP LEDs, which emit light at a wavelength which is readily absorbed by silicon, thus efficiently and quickly heating the substrate. The LEDs may be arranged so that the rotation of the substrate during the alignment process results in a uniform temperature profile of the substrate. Further, heating during alignment may also increase throughput and eliminate preheating stations that are currently associated with the processing chamber.

In one embodiment, a substrate handling and heating system is disclosed. The system comprises a processing chamber; a substrate handling robot disposed in the processing chamber; an alignment station disposed in the processing chamber; and a LED array, comprising a plurality of LEDs, disposed above the alignment station, to heat a substrate during an alignment process. In certain embodiments, the plurality of LEDs emit light at a wavelength between 0.4 and 1.0 μm.

In another embodiment, a substrate handling and heating system is disclosed. The system comprises an alignment station, comprising a rotatable surface on which a substrate is disposed; and a detection system, comprising an emitter disposed on one side of the substrate and a detector disposed on an opposite side of the substrate; an LED array, comprising a plurality of LEDs, disposed above at least a portion of the substrate when the substrate is disposed on the rotatable surface; and a controller to actuate and turn off the LED array. In certain embodiments, the LED array comprises a plurality of zones, wherein each zone can be independently controlled by the controller. In certain embodiments, the detector detects light at a second wavelength different from that emitted by the plurality of LEDs. In certain embodiments, the detector comprises a notch filter to remove light emitted by the plurality of LEDs. In certain embodiments, the plurality of LEDs in the LED array are disposed over a portion of the substrate, less than an entirety of the substrate. In certain further embodiments, the plurality of LEDs are arranged in a pattern, wherein more light is illuminated on an outer portion of the substrate than is illuminated on a center of the substrate. The pattern may be a wedge pattern or an hour glass shape.

In another embodiment, a substrate handling and heating system is disclosed. The system comprises a substrate handling robot disposed in the processing chamber; an alignment station disposed in the processing chamber; a LED array, comprising a plurality of LEDs, disposed above the alignment station, to heat a substrate during an alignment process; and a controller to actuate and turn off the LED array. In certain embodiments, the controller is in communication with the substrate handling robot, and the controller actuates the LED array based on movements or the position of the substrate handling robot. In certain embodiments, the alignment station comprises a rotatable surface and the controller actuates the LED array based on rotation of the rotatable surface. In certain embodiments, the alignment station comprises a detection system, and the controller actuates the LED array based on information from the detection system.

BRIEF DESCRIPTION OF THE FIGURES

For a better understanding of the present disclosure, reference is made to the accompanying drawings, which are incorporated herein by reference and in which.

DETAILED DESCRIPTION

As described above, in many applications, it is advantageous to preheat a substrate prior to that substrate being processed. Therefore, a system that can be used to heat substrates while the substrates are being oriented would be beneficial.

A substrate handling robot may be used to move a substrate from a load lock to a processing chamber. A load lock typically comprises a sealable chamber, having two points of access. A substrate may be placed in a load lock by opening one of these points of access and placing the substrate in the sealable chamber. The sealable chamber is then pumped down to near vacuum conditions. The second point of access is then opened, and the substrate is removed, typically by the substrate handling robot. The process operates in the reverse manner for substrates leaving the processing chamber. In this disclosure, the term "processing chamber" is used to describe any source or destination for a substrate. For example, a processing chamber may be used to perform a particular process, such as implantation, deposition, etching, doping, amorphization or annealing.

Figure 1:
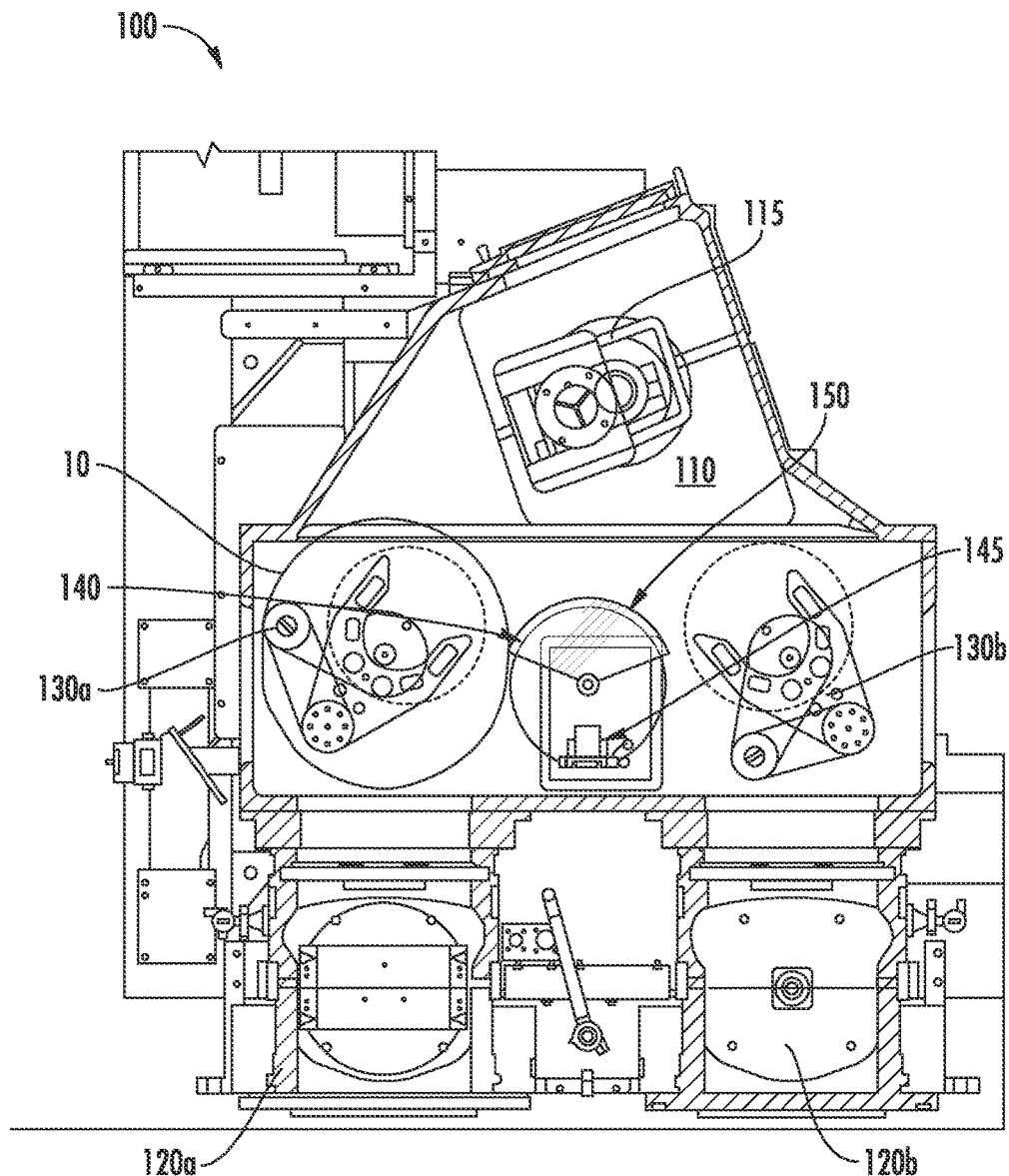
FIG. 1 is a top view of a substrate handling and heating system according to one embodiment.

FIG. 1 shows a top view of the substrate handling and heating system 100 according to one embodiment. The substrate handling and heating system 100 comprises a processing chamber 110, which is in communication with one or more load locks 120a-b.

As described above, the processing chamber 110 may be a chamber in which a process, such as implantation, etching, annealing or deposition, is performed. The processing chamber 110 may be maintained at or near vacuum condition. The processing chamber 110 may include a platen 115, on which the substrate is disposed during processing. The platen 115 may be an electrostatic clamp (ESC), although other others of platens are also within the scope of the disclosure. In certain embodiments, the platen 115 may be a heated platen, capable of heating the substrate to a temperature of 500° C. or higher.

One or more load locks 120a-b are used to transfer substrates 10 from the external environment to the processing chamber 110. Each load lock 120a-b is accessible by a respective substrate handling robot 130a-b. An alignment station 140 is disposed within the processing chamber 110. Each substrate handling robot 130a-b is able to access a respective load lock 120a-b, the platen 115 and the alignment station 140.

The alignment station is used to align the substrate 10 to a particular orientation. Substrates typically include a positional index, such as a notch. This notch determines the orientation of the substrate, and the orientation is typically constant for all substrates when they are processed. However, the orientation of the substrates is indeterminate as they enter the processing chamber 110 from the load lock 120a-b. The alignment station 140 performs this alignment.

Typically, the alignment station 140 comprises a rotatable surface, on which an incoming substrate is placed by the substrate handling robot 130a-b. The alignment station 140 also includes a detection system 145, shown in greater detail in FIG. 2. Disposed above the alignment station 140 is a LED array 150. In some embodiments, the LED array 150 may be between 1 and 20 cm above the substrate 10 when the substrate 10 is disposed on the rotatable surface. In other embodiments, the LED array 150 may be between 1 and 10 cm above the substrate 10. After the substrate is placed on the rotatable surface, the rotatable surface is rotated and, after a certain number of rotations, the substrate is properly oriented. The substrate handling robot 130a-b then transfers the properly oriented substrate to the platen 115.

During the time that the substrate is disposed on the rotatable surface and being rotated to determine its orientation, the LED array 150 may be actuated to heat the substrate during this time. The LED array 150 may comprise a plurality of high power LEDs, which emit light of a wavelength or a plurality of wavelengths that is readily absorbed by the substrates. For example, silicon exhibits high absorptivity and low transmissivity in the range of wavelengths between about 0.4 and 1.0 μm. Silicon absorbs more than 50% of the energy emitted in the range of wavelengths from 0.4 to 1.0 μm. LEDs that emit light in this range of wavelengths may be used. In certain embodiments, LEDs made from GaN are employed. These GaN LEDs emit light at a wavelength of about 450 nm. In certain embodiments, GaP LEDs are employed, which emit light at a wavelength between 610 and 760 nm.

The LEDs which make up the LED array 150 may be varied in size. In certain embodiments, each LED may be 1.3 mm×1.7 mm. In another embodiment, each LED may be 1 mm×1 mm. Of course, LEDs of other dimensions are also within the scope of the disclosure. The density of the LEDs in the LED array 150 may vary. For example, in one embodiment, a density of 8.65 LEDs/cm² may be used. In another embodiment, a density of 18.1 LEDs/cm² may be used. In other embodiments, densities of up to 78 LEDs/cm² may be used. As such, the density of the LED array 150 is not limited by the disclosure.

The LED array 150 may be disposed over the entirety of the substrate on the rotatable surface in some embodiments. In other embodiments, the LED array 150 may only be disposed over a portion of the substrate disposed on the rotatable surface. Since the substrate is rotating during the heating process, the LED array 150 may be configured to have a higher density or greater number of LEDs near the outer edge of the substrate, as compared to the number of LEDs disposed closer to the center of the workpiece. The actual configuration of the LEDs in the LED array 150 may be based on the radius of the substrate to be heated, and the angular velocity of the rotatable surface.

Figure 2:
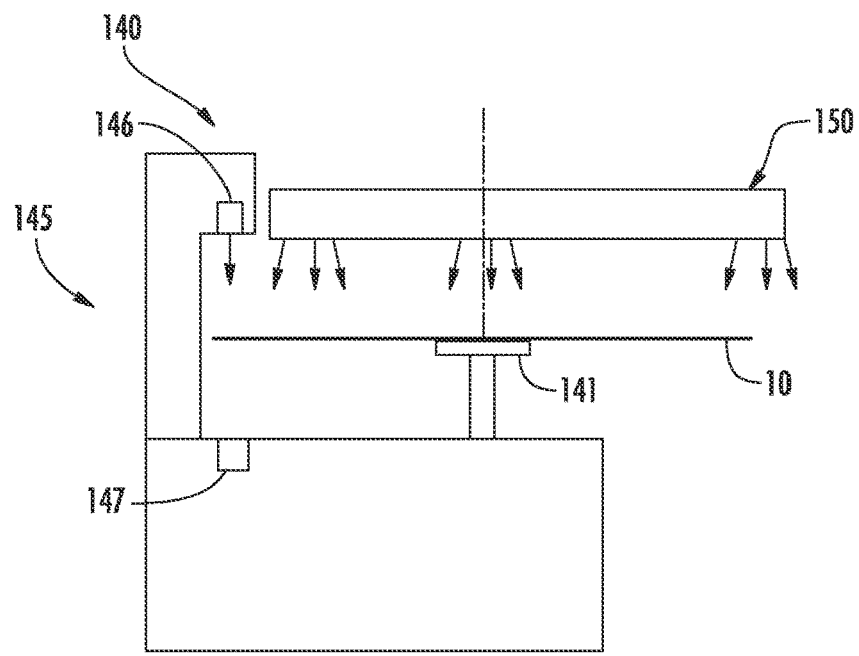
FIG. 2 is a side view of an alignment station according to one embodiment.

FIG. 2 shows a side view of the alignment station 140 and the LED array 150 according to one embodiment. The alignment station 140 comprises a rotatable surface 141 on which a substrate 10 may be disposed. The alignment station 140 also comprises a detection system 145. The detection system 145 may be used to detect the passage of electromagnetic energy (such as visible light, infrared energy, or ultraviolet light) between a emitter 146 disposed on one side of the substrate 10, and a detector 147, located on the opposite side of the substrate 10. As the substrate 10 rotates, the amount of light received by the detector 147 increases when the notch in the substrate is aligned with the emitter 146 and the detector 147 and decreases when the notch is not aligned with the emitter 146 and the detector 147. By detecting this increase in detected light, the detection system 145 is able to determine the precise location of the notch in the substrate 10. Once the location of the notch is determined, the rotatable surface 141 may be stopped, such that the notch in the substrate 10 is disposed in a predetermined location. The substrate handling robot 130*a-b* can then remove the substrate 10 from the rotatable surface 141 and transfer the substrate 10 to the platen 115.

In the embodiment shown in FIG. 2, the LED array 150 is disposed above the entirety of the substrate 10 in at least one direction. As described above, the LEDs in the LED array 150 may emit light at a wavelength of 450 nm or between 610 and 760 nm. Therefore, in certain embodiments, the detection system 145 may use a different wavelength for its detection. For example, rather than using visible light, the emitter 146 may emit infrared light or ultraviolet light. In certain embodiments, the emitter 146 may emit light in a portion of the visible light spectrum that excludes 450 nm, such as red light. In certain embodiments, the emitter may emit light in a portion of the visible light spectrum that excludes 610-760 nm. In each of these embodiments, the detector 147 is selected so as to only detect the range of wavelengths emitted by the emitter 146. In other embodiments, the emitter 146 may utilize visible light, and the detector 147 may include a notch filter to filter out the light emitted from the LED array 150, if that light is deemed to affect the accuracy of the detection system 145. In certain embodiments, the LED array 150 is disposed above the rotatable surface 141 in a position such that light emitted from the LED array 150 does not reach or interfere with the detector 147.

In certain embodiments, the LED array 150 may be actuated when a substrate 10 is placed on the rotatable surface 141. In certain embodiments, the LED array 150 may be actuated when the rotatable surface 141 begins to rotate. In some embodiments, the LED array 150 is disabled when the rotation stops. In other embodiments, the LED array 150 is disabled when the substrate 10 is removed from the rotatable surface 141. A controller 160 may be used to coordinate the actuation of the LED array 150 with either the actions of the alignment station 140, or with the actions of the substrate handling robot 130*a-b*. In certain embodiments, the controller 160 may receive inputs from at least one of the alignment station 140 and the substrate handling robot 130*a-b*. The controller 160 then actuates and deactivates the LED array 150 based on these inputs.

For example, the controller 160 may receive information from the substrate handling robot 130*a-b* which informs the controller 160 that the substrate handling robot 130*a-b* is disposing a substrate 10 on the rotatable surface 141. This information may be information regarding the motion of the substrate handling robot 130*a-b*, or may be information regarding the position of the substrate handling robot 130*a-b*. For example, the controller 160 may receive information that the arm of the substrate handling robot 130*a-b* is extended toward the alignment station 140. Based on this, the controller 160 may determine that a substrate has been placed on the rotatable surface 141. In certain embodiments, the controller 160 may receive information from the alignment station 140. For example, the controller 160 may receive information from the detection system 145, indicating that the substrate 10 is disposed in the path of the detection system. The controller 160 may also receive information regarding the status of the rotatable surface 141, such as whether the rotatable surface 141 is moving. The controller 160 may use information from any source to determine the appropriate time to actuate and turn off the LED array 150.

In certain embodiments, the controller 160 may also provide outputs to the alignment station 140 or the substrate handling robot 130*a-b*. For example, in certain embodiments, the time to heat the substrate 10 to the desired temperature may exceed the time to properly align the substrate 10. In these embodiments, the controller 160 may inform the alignment station 140 to continue the alignment process for an extended period. In other embodiments, the minimum time used by the alignment station may be adjusted to insure proper heating of the substrate 10.

Figure 3:
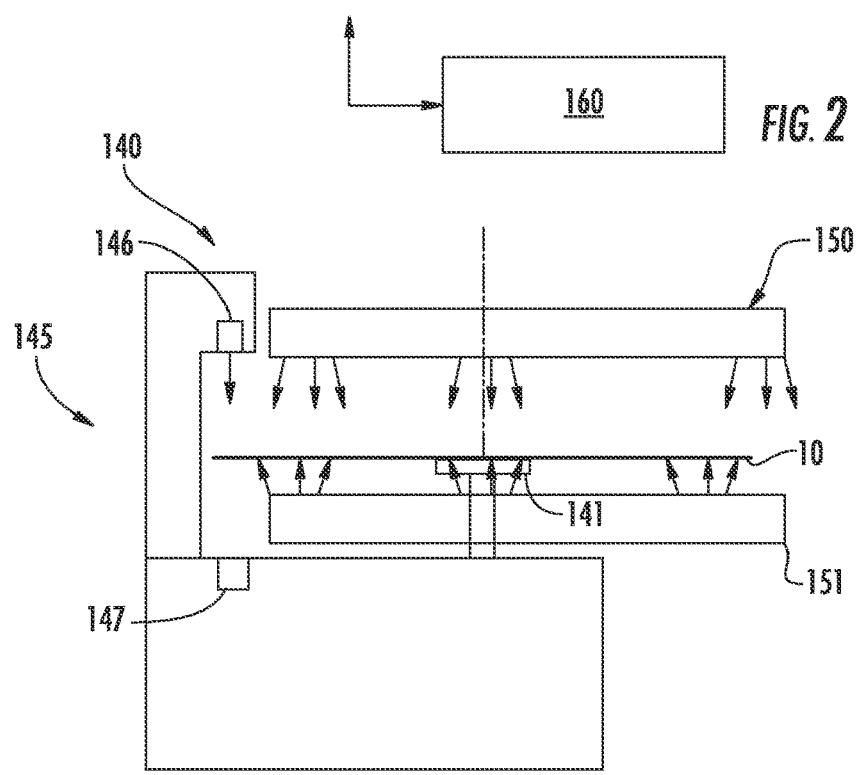
FIG. 3 is a side view of an alignment station according to another embodiment.
Figure 4:
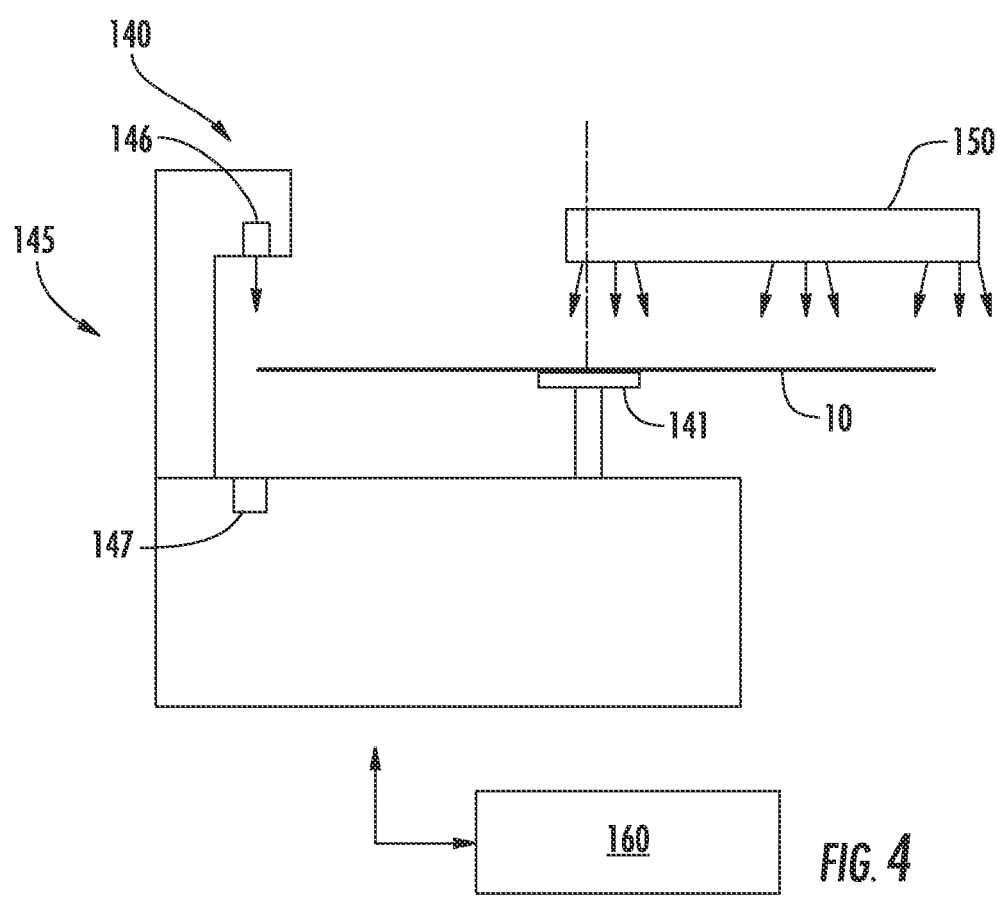
FIG. 4 is a side view of an alignment station according to another embodiment.

While FIGS. 2-4 show a dedicated controller 160 for the LED array 150, other configurations may be used. For example, the control of the LED array 150 may be performed by the controller associated with the alignment station 140. Thus, while a separate controller 160 is shown, it is understood that this controller may also be used to control other components in the substrate handling and heating system.

While FIG. 2 shows the LED array 150 disposed over the substrate 10, other embodiments, are also possible. For example, in certain embodiments, such as that shown in FIG. 3, a second LED array 151 may be disposed beneath the bottom surface of the substrate 10. This second LED array 151 may be disposed so that the second LED array 151 is beneath the entire substrate 10. In certain embodiments, the second LED array 151 is only disposed beneath a portion of the substrate 10. In certain embodiments, the second LED array 151 is used to supplement the heating provided by the LED array 150. In this way, the substrate 10 may be heated more quickly, minimizing the time that the substrate 10 is disposed on the alignment station 140.

FIG. 4 shows another embodiment where the LED array 150 only covers a portion of the substrate 10. For example, in this embodiment, the LED array 150 is disposed over the portion of the substrate 10 opposite the location of the detection system 145. In this way, the light emitted by the LED array 150 may not interfere with the detection system 145. Since the substrate 10 is rotated on the rotatable surface 141, all portions of the substrate 10 are evenly heated, even if the LED array 150 is smaller than the surface area of the substrate 10.

The LEDs which make up the LED array 150 may be divided into zones, where the LEDs in each zone behave as a single entity. In other words, all LEDs in a particular zone are illuminated and turned off together. Further, the power applied to each LED in a particular zone by the controller 160 may be the same.

In some embodiments, the LEDs in the LED array 150 may be one zone, such that all of the LEDs are actuated and turned off at the same time, and are supplied with the same power. In other embodiments, each zone comprises a plurality of LEDs, less than the entire number of LEDs in the LED array 150. In other embodiments, a zone may comprise a single LED. Further, zones may be of different shapes and numbers of LEDs. By dividing the LED array 150 into zones, it may be possible to customize the actuation of the LEDs in the LED array 150 to achieve the desired substrate temperature, based on the angular velocity of the rotatable surface 141 and the time that the substrate 10 is on the rotatable surface 141.

The LED array 150 may be formed in a plurality of different shapes. For example, in certain embodiments, the LED array 150 is a circular array, having a diameter which may be slightly larger than the diameter of the substrate 10. In this embodiment, LEDs may be disposed on the entire circular array. In further embodiments, the controller 160 may vary the power applied to each zone in the LED array 150.

In another embodiment, the LED array 150 may not be the same shape as the substrate 10. For example, in certain embodiments, the LED array 150 may be rectangular in shape. For example, the configuration of the processing chamber 110 may make it difficult to dispose the LED array 150 above the entire substrate. Further, the detection system 145 may make it difficult to dispose the LED array 150 over the entirety of the substrate 10. In certain embodiments, the substrate may have a diameter of 300 mm. The LED array 150 may be a rectangle having a length and width, which may be, for example, 500 mm. In other embodiments, at least one of the dimensions of the LED array 150 may be smaller than the diameter of the substrate 10, such as small as 100 mm.

Figure 5A:
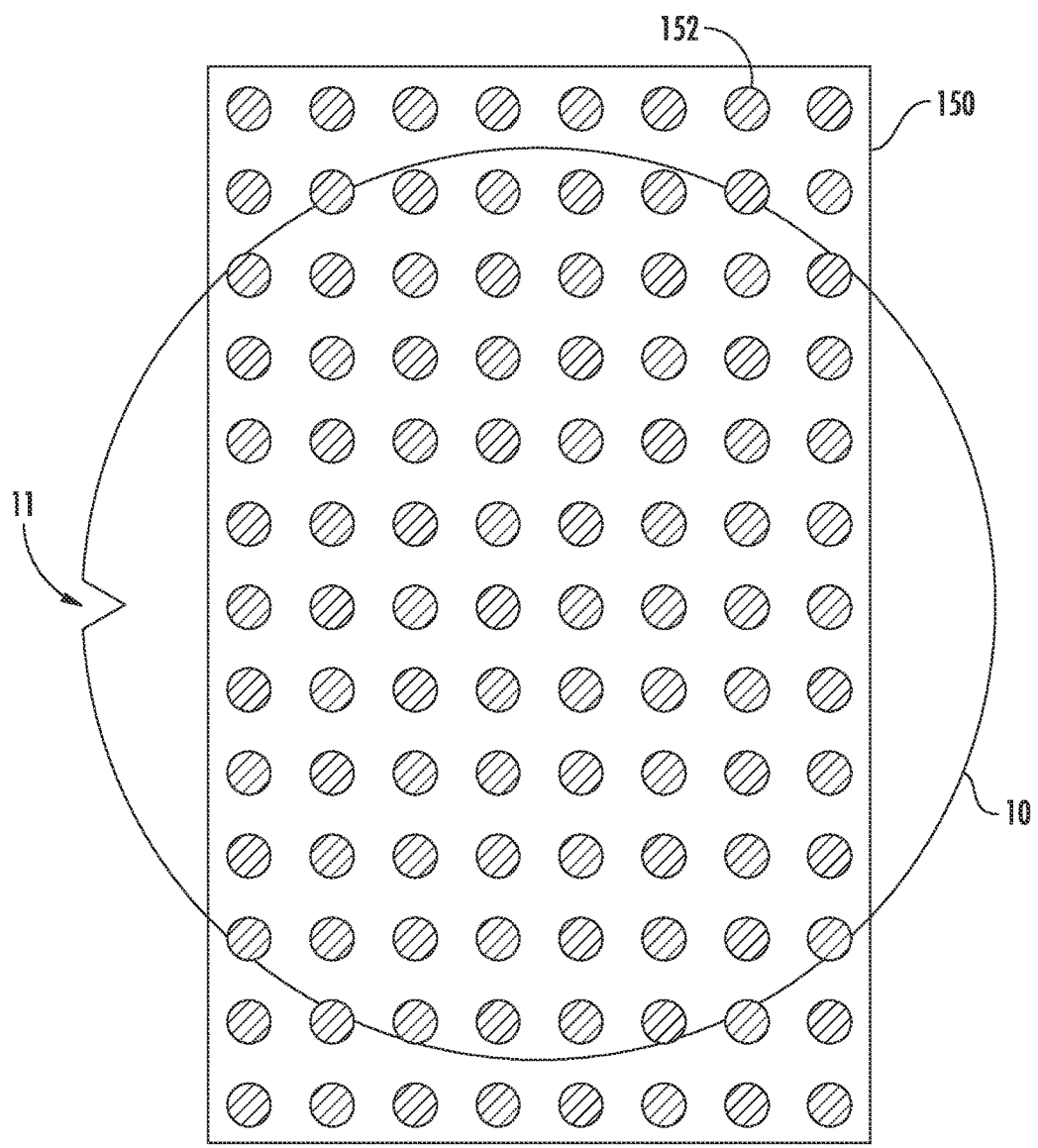
FIGS. 5A-C are various embodiments of a LED array that may be used with the substrate handling and heating system of FIG. 1.
Figure 5B:
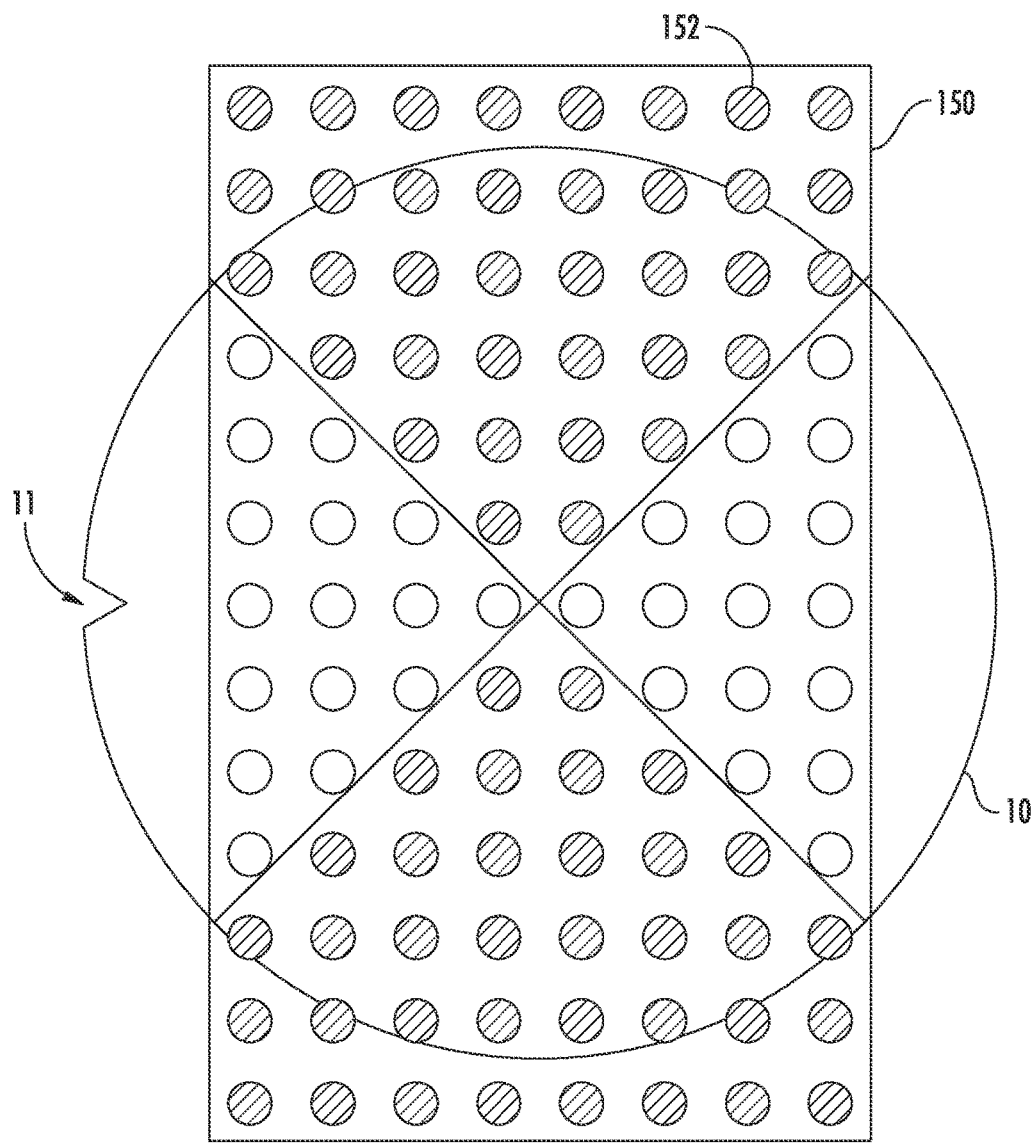
Figure 5C:
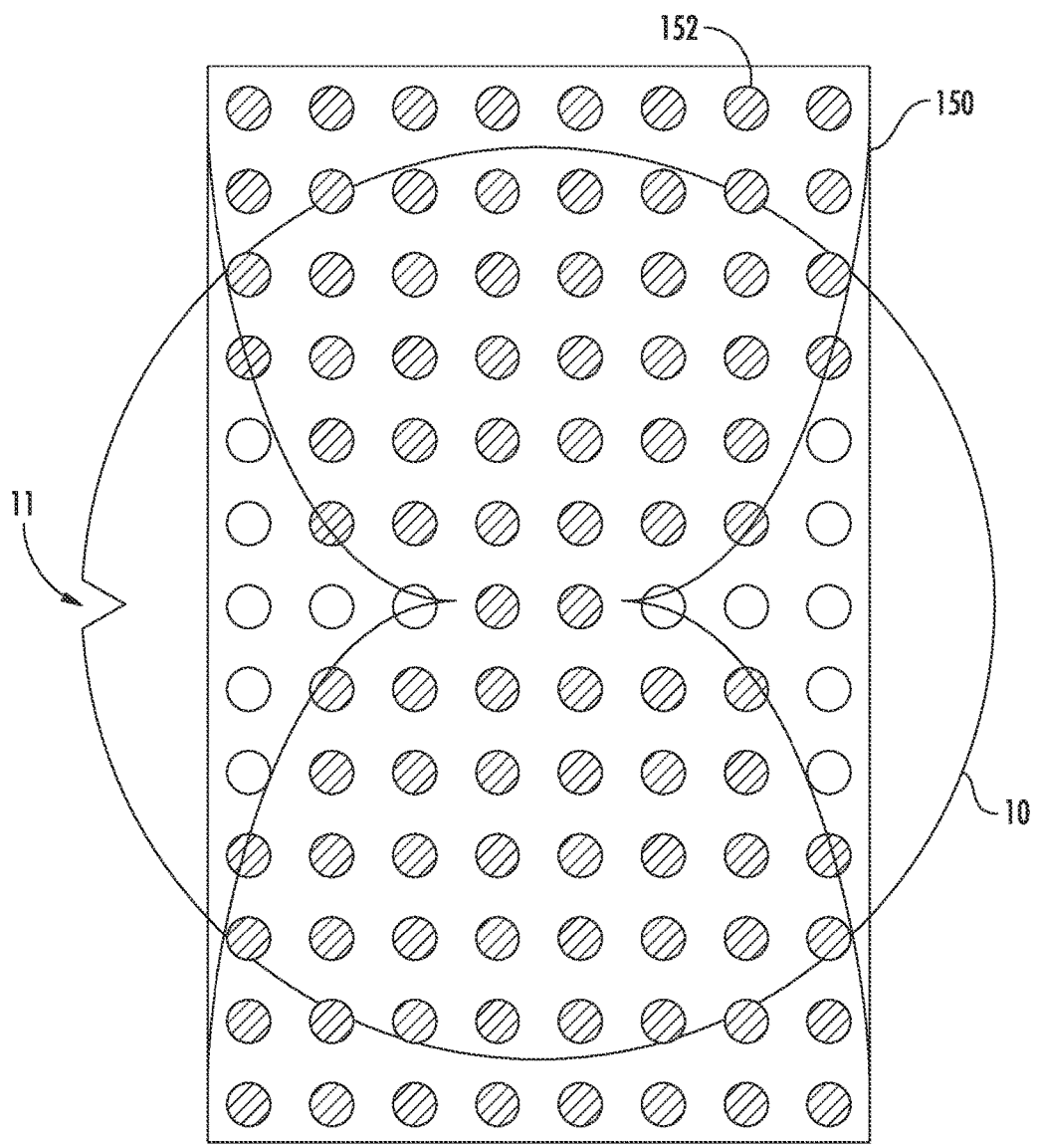

FIGS. 5A-5C show a LED array 150 that is arranged as a rectangle over the substrate 10. Of course, the LED array 150 may be other shapes. In each embodiment, the substrate 10 comprises a notch 11. This notch 11 is detected and oriented by the alignment station 140. In certain embodiments, the detection system 145 may be disposed on one side of the LED array 150. For example, in the embodiment shown in FIG. 5A, the detection system 145 may be disposed proximate the notch 11. In each embodiment, the LED array 150 comprises a plurality of LEDs 152 arranged in rows and columns. In this figures, LEDs 152 shown in cross-hatch are illuminated, while the remaining LEDs 152 are turned off. Illumination of all LEDs 152 in this LED array 150, as shown in FIG. 5A, may result in a non-uniform temperature profile of the substrate 10. This may be due to the fact that portions of the substrate 10 near the center are always disposed beneath the LED array 150, while portions of the substrate 10 near the outer edge are only disposed beneath the LED array 150 a fraction of the time.

To compensate for this, the LEDs in the LED array 150 may be actuated in a pattern that more evenly heats the rotating substrate 10. This may be achieved by varying the power or illumination of various LEDs 152 in the LED array 150. FIG. 5B shows an embodiment where the LEDs 152 that are illuminated form a wedge pattern. This wedge pattern comprises two wedges where roughly 50% of the substrate 10 is disposed beneath LEDs 152 that are illuminated at any given time. The wedge pattern may be created by illuminating only a portion of the LEDs 152. In other embodiments, the LED array 150 is designed to have LEDs 152 only in the illuminated positions. In a further embodiment, the wedge pattern of FIG. 5B may be reduced to a single wedge, which covers only 25% of the substrate 10. In certain embodiments, the wedges are not formed with a right angle at the center of the substrate 10. For example, a smaller or larger angle may be used in certain embodiments.

Other configurations are also possible. For example, FIG. 5C shows another embodiment, where the LEDs 152 that are illuminated in an "hour-glass" pattern. Again, in this embodiment, more LEDs 152 are illuminated near the outer edge of the substrate 10 to insure a uniform temperature profile.

Other patterns may also be used. These patterns may be created using a single power level for all of the LEDs 152 that are illuminated. However, by varying the power level to each LED 152, other patterns may also be possible. For example, referring to FIG. 5A, if the LEDs 152 near the outer edge of the substrate 10 are supplied with more power than those close to the center of the substrate, a more uniform temperature profile may be achieved.

In embodiments where the LED array 150 does not completely cover the substrate 10, it may be beneficial to arrange the LEDs 152 such that there is more light emitted along the outer edge of the substrate 10 then near the center. This may be because the linear velocity of the outer edge of the substrate 10 is much greater than that of the center of the substrate 10. As a result, the inner portion of the substrate 10 may be disposed beneath the LED array 150 for a longer period of time that the outer edge. The patterns shown in FIGS. 5B-5C attempt to compensate for this by having a greater number of LEDs 152 near the outer edge of the substrate 10. Of course, patterns other than those shown in FIGS. 5B-5C may be used as well. In certain embodiments, rather than changing the number of LEDs 152 as a function of the radius of the substrate 10, the power applied to the LEDs 152 is varied according to the radius. For example, as described above, a higher power may be applied to the LEDs 152 disposed near the outer edge of the substrate 10.

Figure 6A:
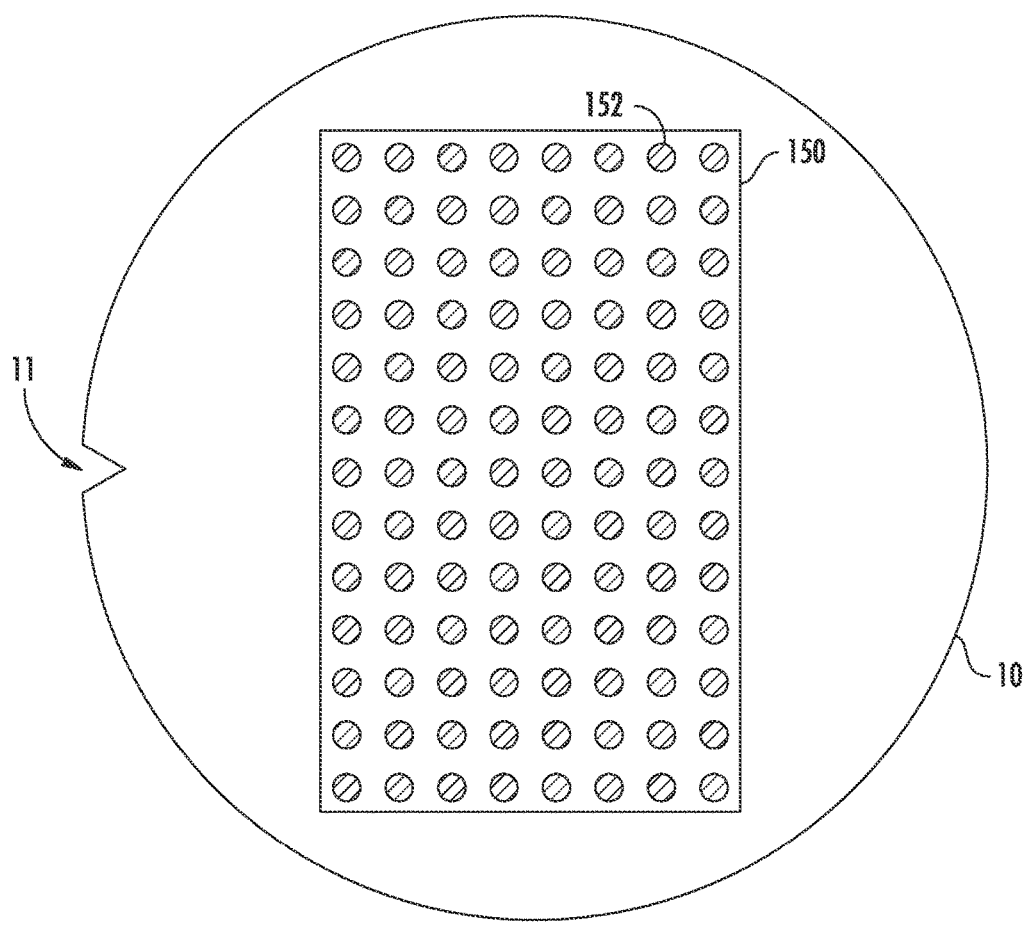
FIGS. 6A-6B show another embodiment of a LED array that may be used with the substrate handling and heating system of FIG. 1.
Figure 6B:
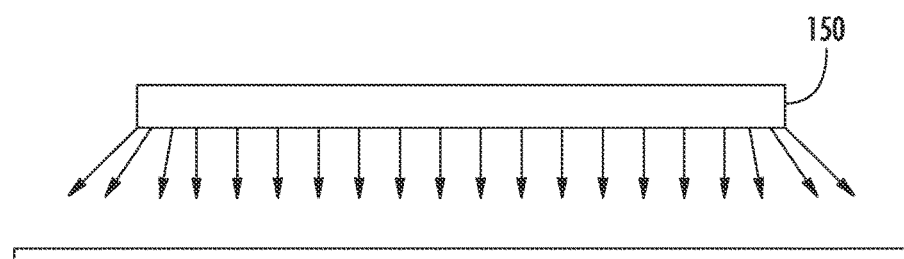

While FIGS. 5A-5C show a LED array 150 that has at least one dimension that is greater than the diameter of the substrate 10, other embodiments are also within the scope of the disclosure. For example, FIG. 6A shows a LED array 150 which has a length and width that are both smaller than the diameter of the substrate 10. For example, in one embodiment, the substrate 10 may have a diameter of 300 mm, while the longer dimension of the LED array 150 may be 250 mm or less. The shorter dimension of the LED array 150 may be, for example 150 mm or less. By placing the LED array 150 a predetermined distance above the substrate 10, the light emitted from the LEDs may be dispersed to illuminate the substrate 10 across its entire diameter. FIG. 6B shows the light from the LEDs being dispersed to illuminate the substrate 10. Furthermore, as described above, more power or more LEDs may be employed near the outer edge of the LED array 150 to compensate for the fact that the LED array 150 is smaller than the substrate 10.

Having described the configuration, the operation of the substrate handling and heating system 100 will be described, referring to FIG. 1 and FIG. 7. First, as shown in Process 700, the substrate handling robot 130*a-b* removes the substrate 10 from the load lock 120*a-b*. This may be achieved by extending the arm of the substrate handling robot 130*a-b* into the respective load lock 120*a-b* and removing the substrate 10.

The substrate handling robot 130*a-b* then places the substrate 10 on the alignment station 140, and more particularly, on the rotatable surface 141, as shown in Process 710.

This action initiates the alignment sequence, as shown in Process 720, where the rotatable surface 141 begins rotating and the detection system 145 is activated. This action by the substrate handling robot 130*a-b* may also be used by the controller 160 to actuate the LED array 150. As noted above, in other embodiments, the rotation of the rotatable surface 141 of the alignment station 140 may be used to signal the controller 160.

In either embodiment, the controller 160 then illuminates the LED array 150 disposed proximate to the alignment station 140, as shown in Process 730. As described above, in certain embodiments, the LED array 150 may be disposed above at least a portion of the substrate 10 while the substrate 10 is disposed on the rotatable surface 141. In certain embodiments, a second LED array 151 may be disposed beneath at least a portion of the substrate 10 while disposed on the rotatable surface 141. In certain embodiments, multiple LED arrays may be used.

Later, as shown in Process 740, the alignment process is complete and the LED array 150 is turned off by the controller 160. These two events may not terminate at the same time. For example, the LED array 150 may be disabled before the alignment process is completed. The amount of time to heat the substrate 10 may be based on the current temperature of the substrate 10 and the target final temperature of the substrate 10. In other embodiments, the alignment process may be completed before the substrate reaches the target temperature. In this embodiment, the rotatable surface 141 may continue rotating to insure a uniform temperature profile for the substrate 10.

After, the substrate handling robot 130*a-b* removes the substrate 10 from the rotatable surface 141 of the alignment station 140, as shown in Process 750. The substrate 10 is then placed on the platen 115 by the substrate handling robot 130*a-b*, as shown in Process 760.

When the processing of the substrate 10 is completed, the substrate handling robot 130*a-b* may remove the substrate 10 from the platen 115 and return the substrate 10 to the load lock 120*a-b*. In certain embodiments, the substrate handling robot 130*a-b* used to place the substrate 10 on the platen 115 may be different than the substrate handling robot 130*a-b* used to remove the substrate 10 from the platen 115.

While the disclosure describes the substrate handling and heating system in the context of heating substrates prior to processing, the system may be used in other ways as well. For example, in certain embodiments, the processing chamber 110 may be maintained at a low temperature, such as less than 0° C., such that substrate 10 may be processed at a cold temperature. If this cooled substrate were to be returned directly to the load lock 120*a-b* immediately after processing, condensation may occur on the substrate. Thus, in the case of cold processing, it may be beneficial to warm the substrate after processing.

Figure 7:
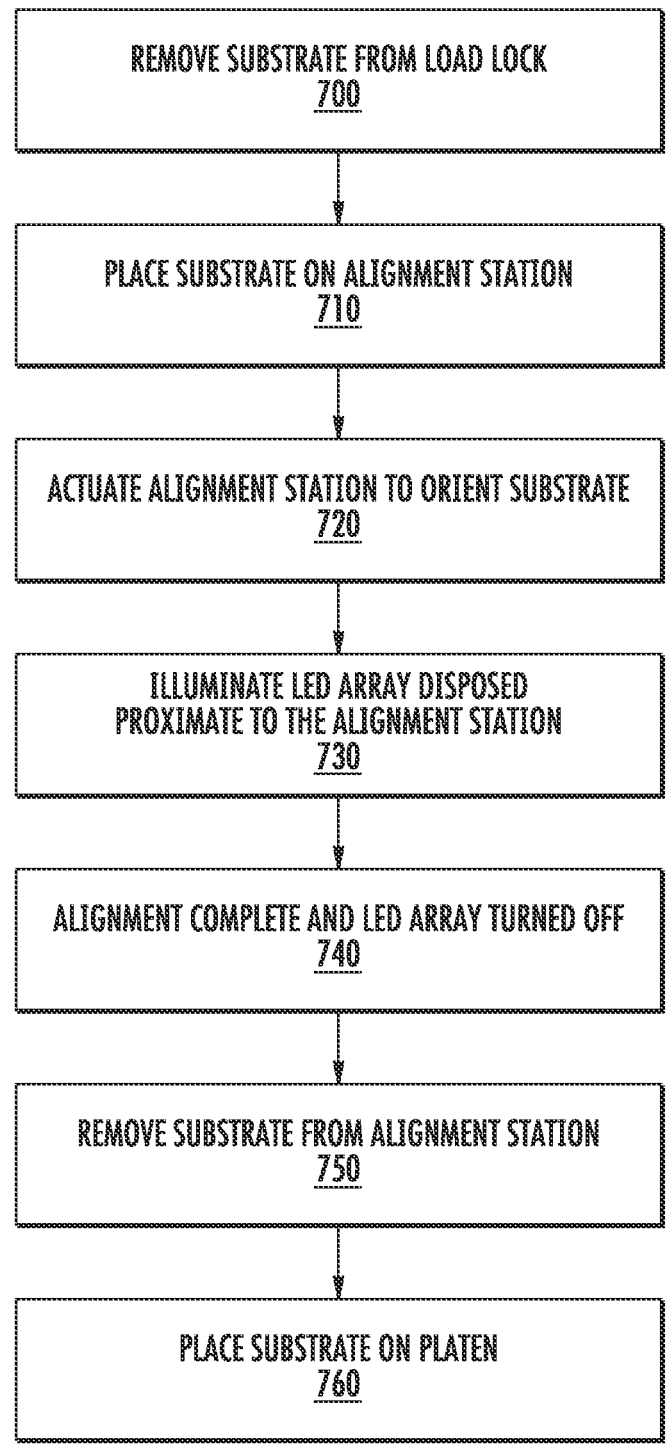
FIG. 7 is a method of heating a substrate according to one embodiment.
Figure 8:
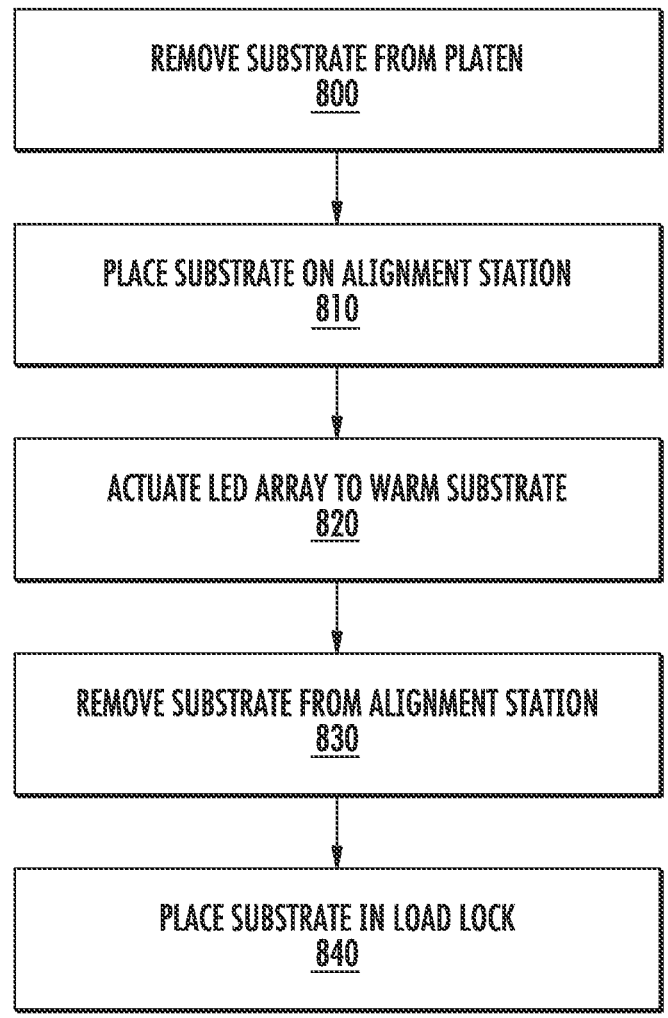
FIG. 8 is a method of warming a substrate after processing according to one embodiment.

The process used during cold processing of a substrate 10 is shown in FIGS. 7 and 8. First, the sequence shown in FIG. 7 is used to move the substrate 10 from the load lock 120*a-b* to the platen 115. However, in this embodiment, Process 730 is not performed, as the substrate 10 will be processed at a cold temperature. After the substrate 10 has finished processing, the substrate 10 is returned to the load lock, such as by using the sequence shown in FIG. 8.

First, the substrate 10 is removed from the platen 115 by the substrate handling robot 130*a-b*, as shown in Process 800. The substrate handling robot 130*a-b* then places the substrate 10 on the alignment station 140, as shown in Process 810. In certain embodiments, the rotatable surface 141 may begin rotating. In other embodiments, the rotatable surface 141 may remain stationary. The LED array 150 is then actuated, allowing the substrate 10 to be warmed, as shown in Process 820. During this warming process, orientation of the workpiece may or may not be performed. After the substrate 10 has reached a target temperature, the rotatable surface 141 may be stopped, if rotating, and the substrate 10 may be removed from the alignment station 140 by the substrate handling robot 130*a-b*, as shown in Process 830. The substrate handling robot 130*a-b* then places the warmed substrate in the load lock 120*a-b*, as shown in Process 840.

The embodiments described above in the present application may have many advantages. First, heating of a substrate prior to processing is a common semiconductor fabrication process. By integrating the heating process with an alignment process, throughput of the processing chamber may be improved. Further, incorporation of the heating process with the alignment process also allows for the removal of preheating stations. These preheating stations increase cost, footprint and complexity. These preheating stations consume space within the processing chamber. Further, as described above, the location of the preheating station is limited, as the substrate handling robot accesses the preheating station. Thus, often, the configuration within the processing chamber is cluttered and tightly spaced, making service and maintenance of the processing chamber very difficult. Additionally, the flow of substrates in the processing chamber is simplified, as there are at least two fewer motions (i.e. to the preheating station and from the preheating station) that are no longer performed by the substrate handling robot 130*a-b*.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate handling and heating system, comprising:
 a processing chamber;
 a substrate handling robot disposed in the processing chamber;
 an alignment station disposed in the processing chamber, wherein the alignment station aligns a substrate in a proper orientation using a notch in the substrate, the alignment station comprising:
 a rotatable surface on which a substrate is disposed; and a detection system, comprising an emitter disposed on one side of the substrate and a detector disposed on an opposite side of the substrate to receive light from the emitter; and a LED array, comprising a plurality of LEDs, disposed above the alignment station, to uniformly heat the substrate during an alignment process, wherein the LED array is disposed over only a portion of the substrate, less than an entirety of the substrate and wherein the plurality of LEDs emit light at a wavelength absorbed by the substrate, wherein light from the LED array does not affect the detection system;

wherein the detector is disposed a distance from a center of the rotatable surface, and the LED array is rectangular, having one dimension greater than the twice the distance and a second dimension less than the twice the distance.

2. The substrate handling and heating system of claim 1, wherein the wavelength is between 0.4 and 1.0 μm.

3. The substrate handling and heating system of claim 2, wherein the emitter emits and the detector detects light at a second wavelength different from that emitted by the plurality of LEDs.

4. The substrate handling and heating system of claim 2, wherein the detector comprises a notch filter to remove light emitted by the plurality of LEDs.

5. The substrate handling and heating system of claim 1, wherein the plurality of LEDs are illuminated while the rotatable surface is rotating.

6. The substrate handling and heating system of claim 1, wherein the LEDs that are illuminated are in a wedge pattern over the substrate, wherein a wedge is defined as a sector of a circle.

7. The substrate handling and heating system of claim 6, wherein the wedge pattern comprises two wedges such that 50% of the substrate is disposed beneath the illuminated LEDs.

8. The substrate handling and heating system of claim 6, wherein the wedge pattern comprises one wedge such that 25% of the substrate is disposed beneath the illuminated LEDs.

9. The substrate handling and heating system of claim 1, wherein the LEDs that are illuminated are in an hour glass shape over the substrate.

10. A substrate handling and heating system, comprising:
a substrate handling robot disposed in a processing chamber;
an alignment station disposed in the processing chamber, wherein the alignment station aligns the substrate in a proper orientation using a notch in the substrate, the alignment station comprising:
a rotatable surface on which a substrate is disposed; and
a detection system, comprising an emitter disposed on one side of the substrate and a detector disposed on an opposite side of the substrate to receive light from the emitter;
a LED array, comprising a plurality of LEDs, disposed above the alignment station, to heat a substrate during an alignment process, wherein the plurality of LEDs emit light at a wavelength absorbed by the substrate and the LED array is not disposed over a portion of the substrate; and a controller to actuate and turn off the LED array, wherein the controller actuates the LED array during an alignment process to achieve a uniform temperature profile of the substrate, and wherein the controller is in communication with the alignment station such that the rotatable surface continues rotating until both the uniform temperature profile for the substrate is achieved and the alignment process is complete;

wherein the detector is disposed a distance from a center of the rotatable surface, and the LED array is rectangular, having one dimension greater than twice the distance and a second dimension less than twice the distance.

11. The substrate handling and heating system of claim 10, wherein said controller is in communication with the substrate handling robot, such that the controller actuates the LED array based on movements of the substrate handling robot.

12. The substrate handling and heating system of claim 10, wherein said controller is in communication with the substrate handling robot, such that the controller actuates the LED array based on a position of the substrate handling robot.

13. The substrate handling and heating system of claim 10, wherein the controller actuates the LED array based on rotation of the rotatable surface.

14. The substrate handling and heating system of claim 10, wherein the alignment station comprises a detection system, and the controller actuates the LED array based on information from the detection system.

15. The substrate handling and heating system of claim 10, wherein the controller, the alignment station and a substrate handling robot are in communication such that the LED array is illuminated by the controller while a substrate is disposed on the alignment station, and the substrate is being rotated.

16. The substrate handling and heating system of claim 10, wherein the LEDs that are illuminated are in a wedge pattern over the substrate, wherein a wedge is defined as a sector of a circle.

17. The substrate handling and heating system of claim 16, wherein the wedge pattern comprises two wedges such that 50% of the substrate is disposed beneath the illuminated LEDs.

18. The substrate handling and heating system of claim 16, wherein the wedge pattern comprises one wedge such that 25% of the substrate is disposed beneath the illuminated LEDs.

19. The substrate handling and heating system of claim 10, wherein the LEDs that are illuminated are in an hour glass shape over the substrate.

20. The substrate handling and heating system of claim 10, wherein the LED array is turned off if the uniform temperature profile for the substrate is achieved prior to completion of the alignment process.

* * * * *